United States Patent [19]

Wender

[11] Patent Number: 5,761,251

[45] Date of Patent: Jun. 2, 1998

[54] DUAL AUTOMATIC GAIN CONTROL AND DC OFFSET CORRECTION CIRCUIT FOR QAM DEMODULATION

[75] Inventor: Andrew Reid Wender, Knoxville, Tenn.

[73] Assignee: Philips Electronics North America Corporation, New York, N.Y.

[21] Appl. No.: 555,026

[22] Filed: Nov. 8, 1995

[51] Int. Cl.[6] .................................................. H04B 1/06
[52] U.S. Cl. ......................... 375/345; 329/304; 329/308; 455/219
[58] Field of Search ........................... 375/345, 317, 375/319, 323, 235, 261; 329/304, 308; 455/219

[56] References Cited

U.S. PATENT DOCUMENTS

| 5,036,527 | 7/1991 | Halim et al. | 375/345 |
| 5,539,779 | 7/1996 | Nagahori | 375/317 |
| 5,563,916 | 10/1996 | Scarpa | 375/345 |

Primary Examiner—Wellington Chin
Assistant Examiner—Congvan Tran
Attorney, Agent, or Firm—Steven R. Biren

[57] ABSTRACT

A circuit arrangement capable of achieving both DC offset correction and automatic gain control for QAM demodulation. The QAM signal is digitized and then the positive signal samples are averaged and combined with the negative signal samples. The sum of these two averages is an indication of the DC offset while the difference of these two averages is an indication of the gain factor for automatic gain control. Common circuitry is then alternately used to process the DC offset and the gain factor for automatic gain control.

5 Claims, 7 Drawing Sheets

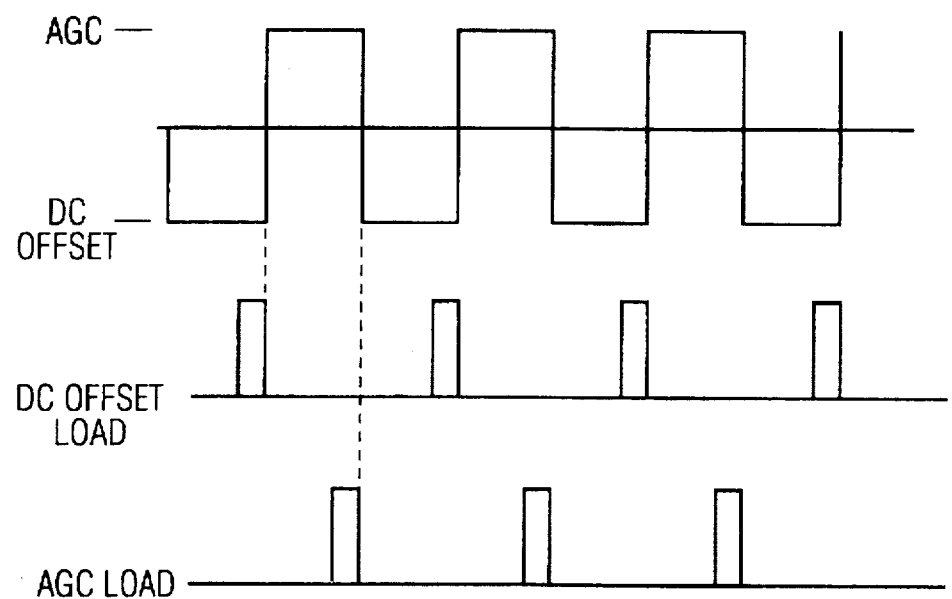

DUAL AUTOMATIC GAIN CONTROL AND DC OFFSET CORRECTION CIRCUIT FOR QAM DEMODULATION

BACKGROUND OF THE INVENTION

1. Field of the Invention

The subject invention relates to the demodulation of quadrature amplitude modulation (QAM) signals.

2. Description of the Related Art

QAM systems require analog input signals which have gain and DC offset errors minimized if denser QAM constellations are to be operated in a noisy environment.

Analog-to-digital (A/D) converters have a DC offset that varies from part to part, due to temperature, voltage and time. This DC offset at the A/D converter adds an error to the QAM constellation that effects the overall noise performance of the demodulator. The DC offset shifts all of the constellation points away from the center of the decision region reducing the probability of correct slicing in the presence of noise and/or phase error.

SUMMARY OF THE INVENTION

It is an object of the present invention to provide a circuit arrangement capable of correcting for DC offset in the demodulation of a QAM signal.

This object is achieved in a circuit arrangement for providing signal correction for QAM demodulation, the circuit arrangement comprising means for receiving an input analog QAM signal; analog-to-digital converting means for converting the analog QAM signal into a digital QAM signal samples; first determining means, coupled to said analog-to-digital converting means, for determining which of said digital QAM signal samples represent positive values; first averaging means, coupled to said first determining means, for forming a first average of said digital QAM signal samples representing positive values; second determining means, coupled to said analog-to-digital converting means, for determining which of said digital QAM signal samples represent negative values; second averaging means, coupled to said second determining means, for forming a second average of said digital QAM signal samples representing negative values; first combining means for combining said first average and said second average, said first combining means having an output for providing a combination signal resulting from said second average being added from said first average; and digital-to-analog converting means for converting said combination signal into an analog DC error signal, wherein said receiving means comprises second combining means for combining said DC error signal with said input analog QAM signal, said second combining means having a non-inverting input coupled to receive said input analog QAM signal, an inverting input coupled to receive said DC error signal, and an output coupled to an input of said analog-to-digital converting means.

A further object of the invention is to provide a circuit arrangement capable of providing automatic gain control for QAM demodulation.

This object is achieved in a circuit arrangement for providing signal correction for QAM demodulation, the circuit arrangement comprising means for receiving an input analog QAM signal; analog-to-digital converting means for converting the analog QAM signal into a digital QAM signal samples; first determining means, coupled to said analog-to-digital converting means, for determining which of said digital QAM signal samples represent positive values; first averaging means, coupled to said first determining means, for forming a first average of said digital QAM signal samples representing positive values; second determining means, coupled to said analog-to-digital converting means, for determining which of said digital QAM signal samples represent negative values; second averaging means, coupled to said second determining means, for forming a second average of said digital QAM signal samples representing negative values; combining means for combining said first average and said second average so that said second average is subtracted from said first average forming a difference signal; and digital-to-analog converting means for converting said difference signal into an analog gain control signal, wherein said receiving means comprises gain control means for controlling a gain of said input analog QAM signal in response to said gain control signal, said gain control means having an input coupled to receive said analog QAM signal, a gain control input coupled to receive said analog gain control signal, and an output coupled to an input of said analog-to-digital converting means.

A still further object of the invention is to provide a circuit arrangement capable of achieve both DC offset correction and automatic gain control for QAM demodulation.

BRIEF DESCRIPTION OF THE DRAWINGS

With the above and additional objects and advantages in mind as will hereinafter appear, the invention will be described with reference to the accompanying drawings, in which:

FIG. 1A shows a QAM envelope signal in time domain with no DC offset, while

FIGS. 8A–8C show timing diagrams for switching signals for the embodiment of FIG. 7.

DESCRIPTION OF THE PREFERRED EMBODIMENTS

Figure 1A:
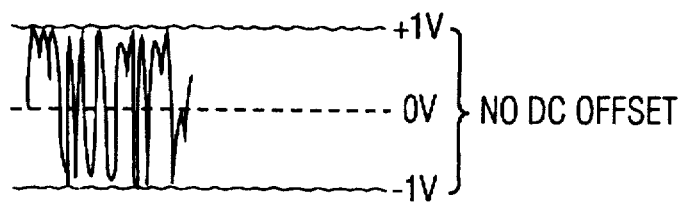
Figure 1B:
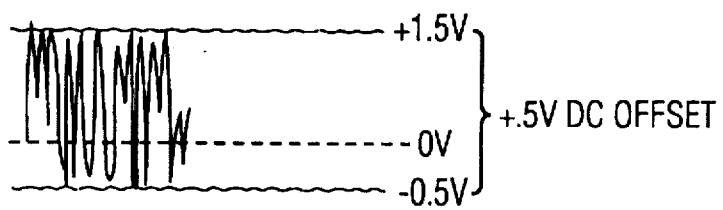
FIG. 1B shows the QAM envelope signal with a DC offset.

FIG. 1A shows a diagram of a QAM envelope signal in the time domain. As shown, the signal has a 2 volt peak-to-peak amplitude centered around the 0 volt axis, i.e., the signal ranges from −1 volt to +1 volt. Hence, this signal does not have any DC offset. Conversely, FIG. 1B shows the same QAM envelope signal having a 2 volt peak-to-peak amplitude. However, in FIG. 1B, the signal ranges from −0.5 volts to +1.5 volts; a DC offset of +0.5 volts.

Figure 2:
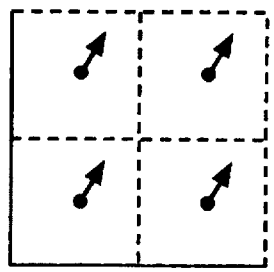
FIG. 2 shows a diagram of the constellation points of a QAM signal in which there is a DC offset in the constellation points.

In FIG. 2, the effect of a DC offset is shown in a diagram of the constellation points of the QAM signal.

The DC offset shifts all of these constellation points away from the center of the decision region thereby reducing the probability of a data slicer from correctly slicing the signal in the presence of noise and/or phase error.

Figure 3:
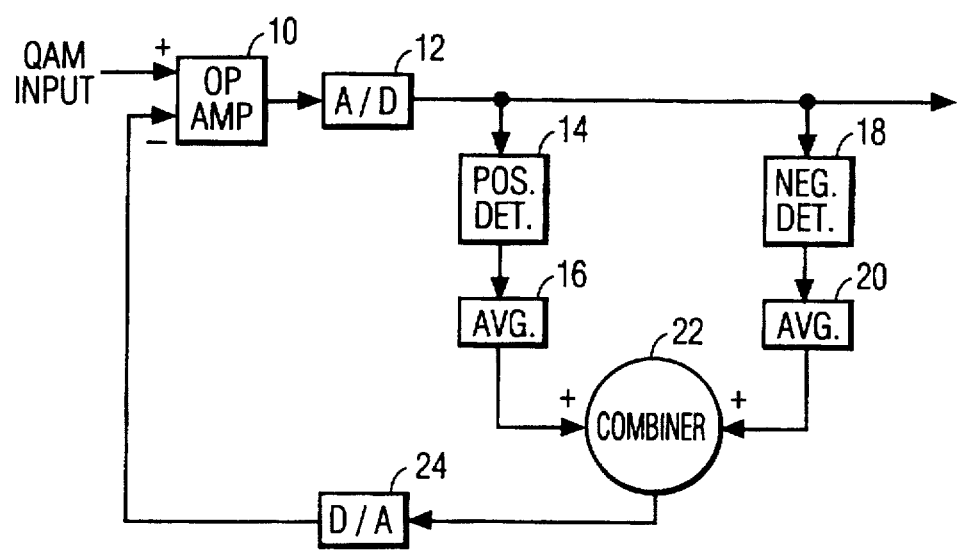
FIG. 3 shows a block diagram of a first embodiment of a circuit arrangement for correcting DC offset.

FIG. 3 shows a block diagram of a first embodiment of a circuit arrangement capable correcting this DC offset. The analog QAM signal is applied to a non-inverting input of operational amplifier 10. The output from operational amplifier 10 is applied to an analog-to-digital (A/D) converter 12. The digitized QAM signal samples at the output of A/D converter 12 is applied to a circuit 14 for determining which of the signal samples represent positive values. These signal samples are then applied to an averager 16. Similarly, the digitized QAM signal samples at the output of A/D converter 12 are applied to a circuit 18 for determining which of the signal samples represent negative values, these negative signal samples being averaged in an averager 20. The outputs from averagers 16 and 20 are applied to the first and second inputs, respectively, of a signal combiner 22 which form a combination signal representing the sum of the signals at its first and second inputs. An output from the signal combiner 22 is applied to a digital-to-analog converter 24. The output from the D/A converter 24, representing the DC offset value, is applied to the inverting input of operational amplifier 10, thereby compensating for the DC offset in the input QAM signal.

Figure 4:
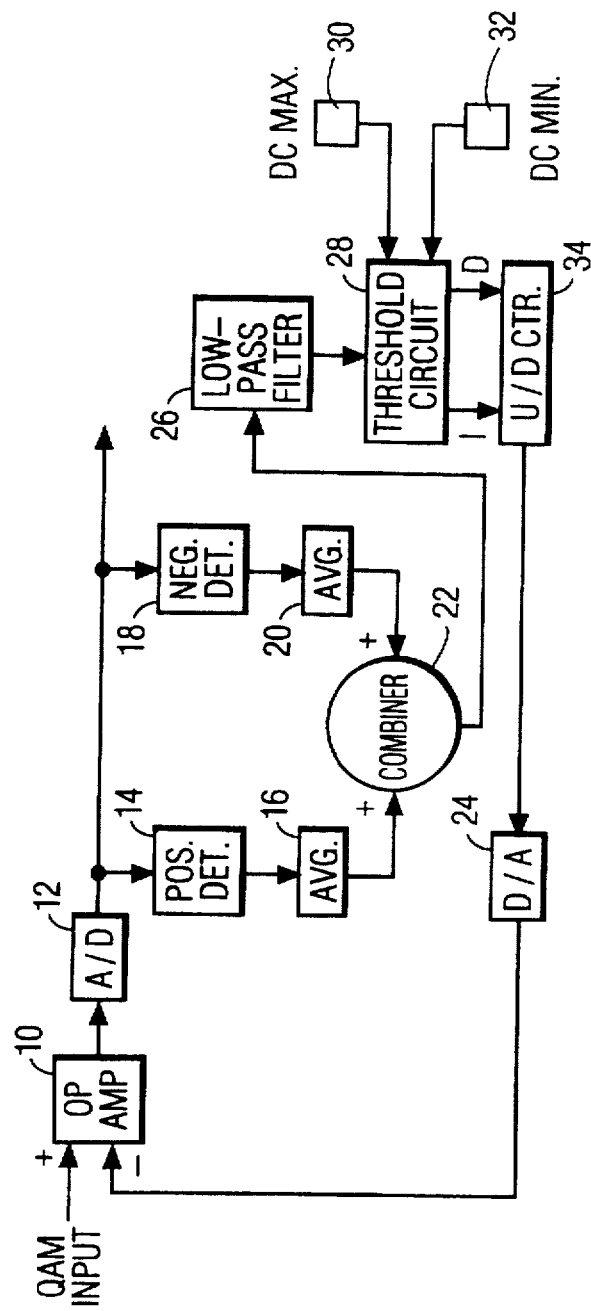
FIG. 4 shows a block diagram of a second embodiment of a circuit arrangement for correcting DC offset.

FIG. 4 shows a second embodiment of the circuit of FIG. 3 in which the same components bear the same reference numbers. The output from the signal combiner 22 is now applied through a low-pass filter 26 to the input of a threshold circuit 28. The threshold circuit 28 receives a signal representing a maximum DC offset value from signal source 30, and a signal representing a minimum DC offset value from signal source 32. If the low-pass filtered combination signal is greater than DC MAX, the threshold circuit 28 applies a signal to its increment (I) output, while if the low-pass filtered combination signal is less than DC MIN, the threshold circuit 28 applies a signal to its decrement (D) output. These outputs (I, D) are applied to the up and down inputs, respectively, of an up/down counter 34. The output from the up/down counter 34, representing the DC offset, is now applied to the D/A converter 24.

Figure 5:
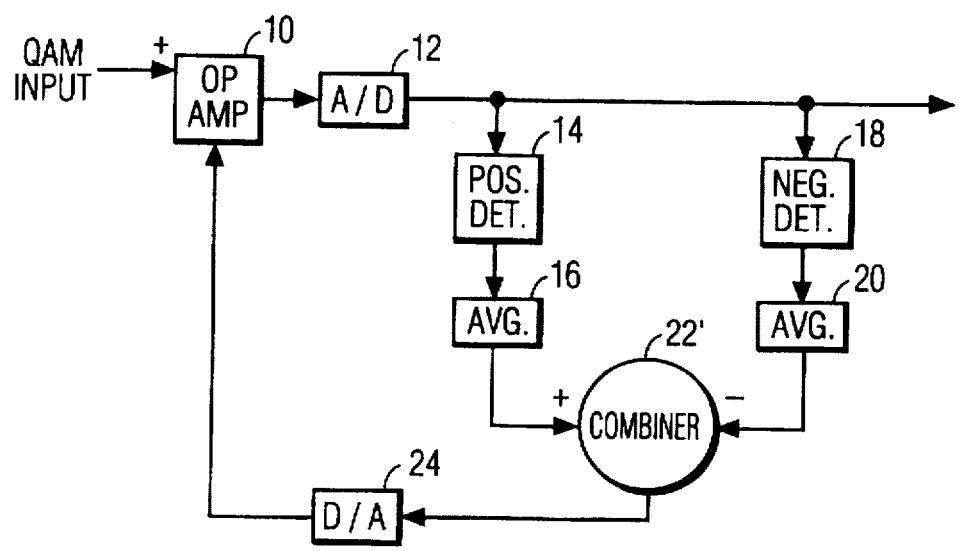
FIG. 5 shows a block diagram of a first embodiment of a circuit arrangement for providing automatic gain control.

FIG. 5 shows a block diagram of a circuit for providing automatic gain control for the QAM signal. This circuit is substantially similar to that shown in FIG. 3 and as such, identical components bear the same reference numbers.

The input operational amplifier 10' now has an input for adjusting its gain. The output from D/A converter 24 is now applied to this gain adjusting input. In addition, the signal combiner 22' now forms the difference between the outputs from the averagers 16 and 20. By applying the resulting signal to the operational amplifier 10' as a gain control signal, the circuit achieves an automatic gain control.

Figure 6:
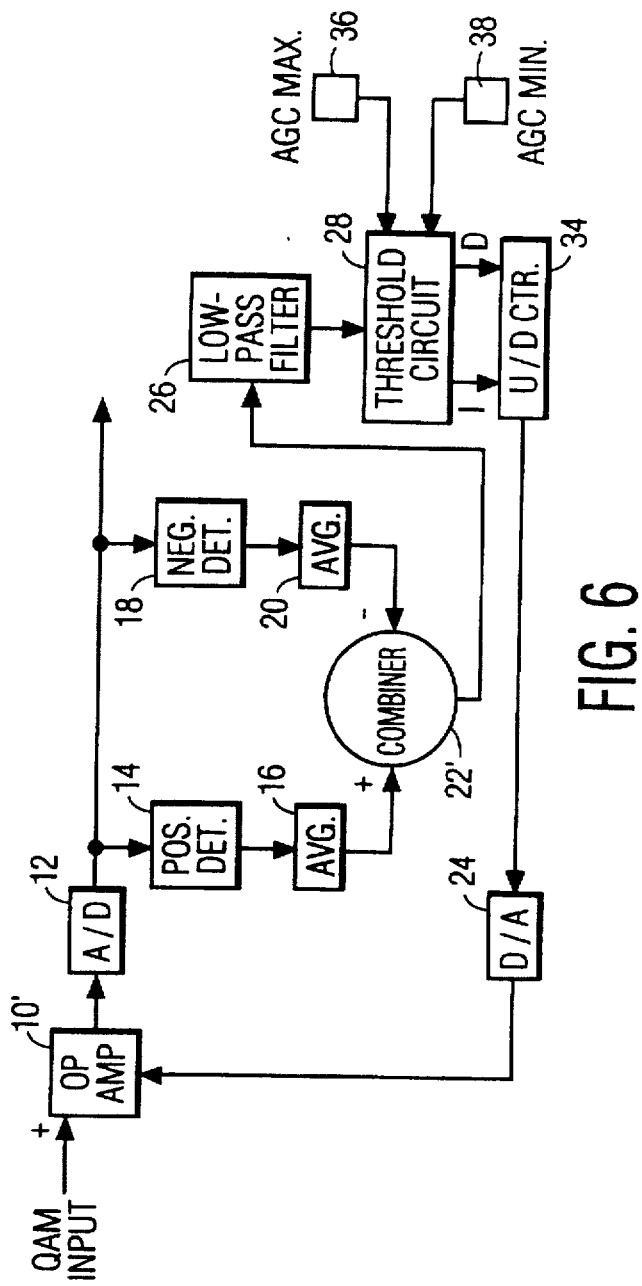
FIG. 6 shows a block diagram of a second embodiment of a circuit arrangement for providing automatic gain control.

FIG. 6 shows as second embodiment of the circuit of FIG. 5 which is substantially similar to that shown in FIG. 4. and as such, identical components bear the same reference numbers.

The output from signal combiner 22' is now applied to the low-pass filter 26, while the sources 30 and 32 are replaced by sources 36 and 38 which provide an AGC MAX value and an AGC MIN value, respectively. The operation of the circuit is similar to that of the circuit of FIG. 4 with the exception that the value applied to the D/A converter 24 is the gain factor.

Figure 7:
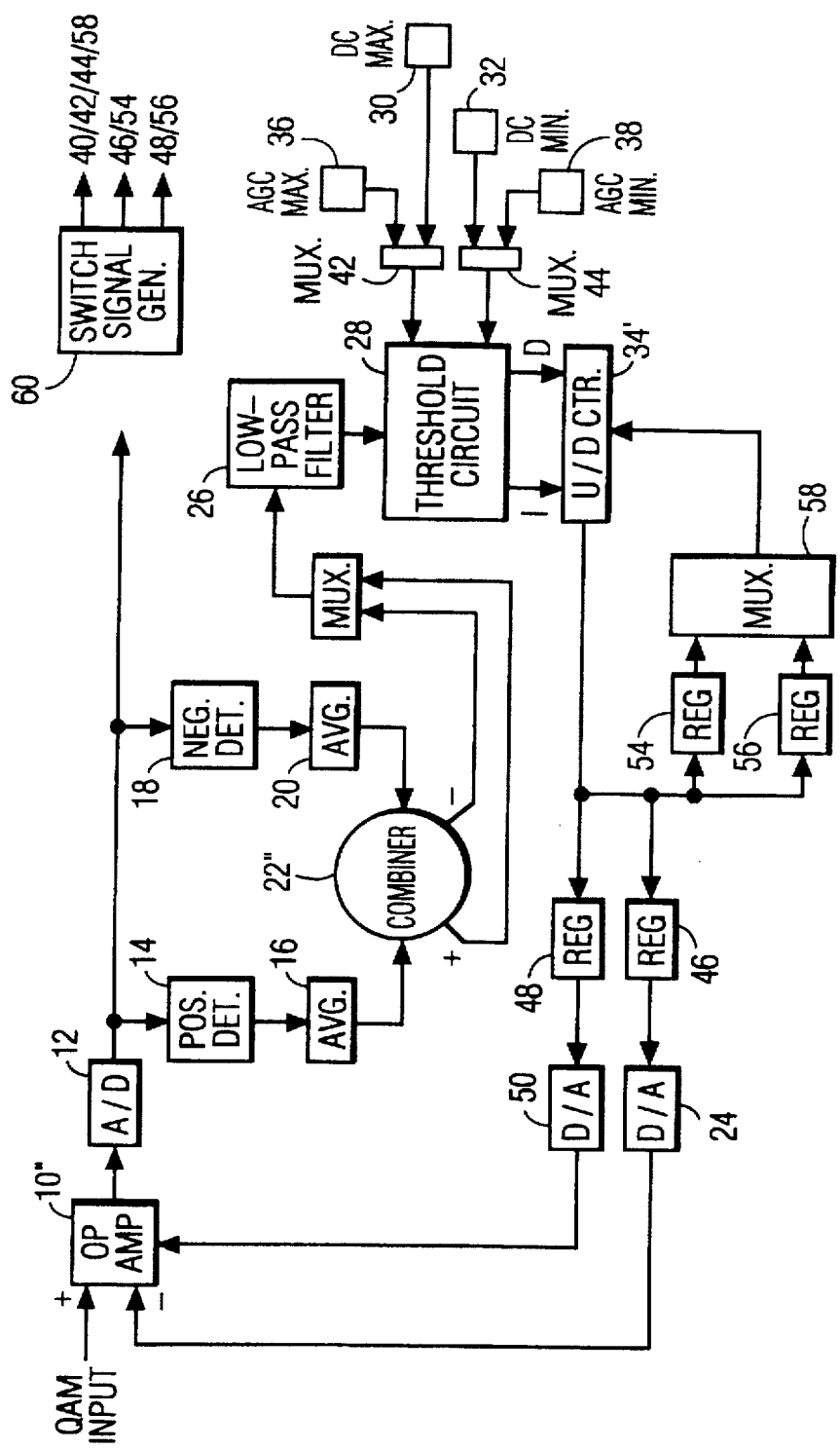
FIG. 7 shows a block diagram of a circuit arrangement for both correcting DC offset and providing automatic gain control.

FIG. 7 shows a block diagram of a combined DC offset correction and automatic gain control circuit. The circuit of FIG. 7 is essentially a combination of the circuits of FIGS. 4 and 6, and as such, identical components have the same reference numbers.

In particular, the signal combiner 22" now has a first output for providing the combination signal and a second output for providing the difference signal. These outputs are applied to the first and second inputs of a multiplexer 40, the output from the multiplexer 40 being applied to the low-pass filter 26. In addition, this embodiment includes the sources 30 and 32 as well as the sources 36 and 38, in which the outputs from the sources 30 and 36 are applied to a multiplexer 42 which applies its output to the maximum threshold input of the threshold circuit 28. Similarly, the outputs from the sources 32 and 38 are applied to a multiplexer 44 which applies its output to the minimum threshold input of the threshold circuit 28. The output from the up/down counter 34' is applied to a register 46 which then applies its output to the D/A converter 24 whose output, representing the DC offset, is applied to the inverting input of operational amplifier 10". The output from the up/down counter 34' is also applied to a register 48 which then applies its output to a D/A converter 50 whose output, representing the gain factor, is applied to the gain control input of operational amplifier 10". In addition, the output from the up/down counter 34' is applied to registers 54 and 56, the outputs therefrom being applied to a multiplexer 58 which applies its output to a count value input of the up/down counter 34'.

A switching signal generator 60 generates a first switching signal for switching the multiplexers 40, 42, 44 and 58 in synchronism, a second switching signal for causing the registers 46 and 54 to store the output signal from the up/down counter 34' representing the DC offset value, and a third switching signal for causing the registers 48 and 56 to store the output signal from the up/down counter 34" representing the gain factor.

FIGS. 8A–8C show timing diagrams for the switching signals from the switching signal generator 60. In particular, as shown in FIG. 8A, the first switching signal, in a first switching phase, causes the combination signal from the "+" output of signal combiner 22" to be connected to the low-pass filter 26, the DC MAX and DC MIN sources 30 and 32 to be connected to the maximum and minimum threshold inputs, respectively, of the threshold circuit 28, and the output of register 54 to be connected to the count value input of the up/down counter 34'. Arranged as such, the circuit arrangement is set to determine the DC offset. Similarly, the first switching signal, in a second switching phase, causes the difference signal from the "−" output of signal combiner 22" to be connected to the low-pass filter 26, the AGC MAX and AGC MIN sources 36 and 38 to be connected to the maximum and minimum threshold value inputs, respectively, of the threshold circuit 28, and the output of register 56 to be connected to the count value input of the up/down counter 34'. Now the circuit arrangement is set to determine the automatic gain control.

The second switching signal, at the end of the first, third, fifth, . . . . switching phases of the first switching signal, causes the registers 46 and 54 to store the current count value residing in the up/down counter 34', which represents the DC offset. Similarly, the third switching signal, at the end of the second, fourth, sixth, etc., switching phases of the first switching signal, causes the registers 48 and 56 to store the current count value residing in the up/down counter 34', which represents the gain factor.

Numerous alterations and modifications of the structure herein disclosed will present themselves to those skilled in the art. However, it is to be understood that the above described embodiment is for purposes of illustration only and not to be construed as a limitation of the invention. All such modifications which do not depart from the spirit of the invention are intended to be included within the scope of the appended claims.

What is claimed is:

1. A circuit arrangement for providing signal correction for QAM demodulation, the circuit arrangement comprising:

means for receiving an input analog QAM signal;

analog-to-digital converting means for converting the analog QAM signal into a digital QAM signal samples;

first determining means, coupled to said analog-to-digital converting means, for determining which of said digital QAM signal samples represent positive values;

first averaging means, coupled to said first determining means, for forming a first average of said digital QAM signal samples representing positive values;

second determining means, coupled to said analog-to-digital converting means, for determining which of said digital QAM signal samples represent negative values;

second averaging means, coupled to said second determining means, for forming a second average of said digital QAM signal samples representing negative values;

first combining means for combining said first average and said second average, said first combining means having an output for providing a combination signal resulting from said second average being added to said first average; and digital-to-analog converting means for converting said combination signal into an analog DC error signal, wherein said receiving means comprises second combining means for combining said DC error signal with said input analog QAM signal, said second combining means having a non-inverting input coupled to receive said input analog QAM signal, an inverting input coupled to receive said DC error signal, and an output coupled to an input of said analog-to-digital converting means.

2. The circuit arrangement as claimed in claim 1, characterized in that said circuit arrangement further comprises:

means for providing a DC maximum threshold value;

means for providing a DC minimum threshold value;

low-pass filter means coupled to an output of said first combining means for low-pass filtering said combination signal;

threshold means coupled to an output of said low-pass filter means, said threshold means having a maximum threshold input coupled to said means for providing a DC maximum threshold value, and a minimum threshold input coupled to said means for providing a DC minimum threshold value, said threshold means having a first output for providing a signal when the low-pass filtered combination signal exceeds said DC maximum threshold value, and a second output for providing a signal when the low-pass filtered combination signal fall below said DC minimum threshold value; and an up/down counter having an incrementing input coupled to said first output of said threshold means and a decrementing input coupled to said second output of said threshold means, an output of said up/down counter being coupled to an input of said digital-to-analog converting means.

3. A circuit arrangement for providing signal correction for QAM demodulation, the circuit arrangement comprising:

means for receiving an input analog QAM signal;

analog-to-digital converting means for converting the analog QAM signal into a digital QAM signal samples;

first determining means, coupled to said analog-to-digital converting means, for determining which of said digital QAM signal samples represent positive values;

first averaging means, coupled to said first determining means, for forming a first average of said digital QAM signal samples representing positive values;

second determining means, coupled to said analog-to-digital converting means, for determining which of said digital QAM signal samples represent negative values;

second averaging means, coupled to said second determining means, for forming a second average of said digital QAM signal samples representing negative values;

combining means for combining said first average and said second average so that said second average is subtracted from said first average to form a difference signal; and digital-to-analog converting means for converting said difference signal into an analog gain control signal, wherein said receiving means comprises gain control means for controlling a gain of said input analog QAM signal in response to said gain control signal, said gain control means having an input coupled to receive said analog QAM signal, a gain control input coupled to receive said analog gain control signal, and an output coupled to an input of said analog-to-digital converting means.

4. The circuit arrangement as claimed in claim 3, characterized in that said circuit arrangement further comprises:

means for providing an AGC maximum threshold value;

means for providing an AGC minimum threshold value;

low-pass filter means coupled to an output of said combining means for low-pass filtering said difference signal;

threshold means coupled to an output of said low-pass filter means, said threshold means having a maximum threshold input coupled to said means for providing an AGC maximum threshold value, and a minimum threshold input coupled to said means for providing an AGC minimum threshold value, said threshold means having a first output for providing a signal when the low-pass filtered difference signal exceeds said AGC maximum threshold value, and a second output for providing a signal when the low-pass filtered difference signal fall below said AGC minimum threshold value; and an up/down counter having an incrementing input coupled to said first output of said threshold means and a decrementing input coupled to said second output of said threshold means, an output of said up/down counter being coupled to an input of said digital-to-analog converting means.

5. The circuit arrangement as claimed in claim 2, wherein the circuit arrangement further provides automatic gain control, characterized in that said first combining means has a further output for providing a difference signal resulting from said second average being subtracted from said first average, and said circuit arrangement further comprises:

means for providing an AGC maximum threshold value;

means for providing an AGC minimum threshold value;

first multiplexer means having a first input coupled to said means for providing a DC maximum threshold value and a second input coupled to said means for providing an AGC maximum threshold value;

second multiplexer means having a first input coupled to said means for providing a DC minimum threshold value and a second input coupled to said means for providing an AGC minimum threshold value, an output from said first multiplexer means being coupled to said maximum threshold input of said threshold means, and an output of said second multiplexer means being coupled to said minimum threshold input of said threshold means;

third multiplexer means having a first input coupled to said output of said first combining means carrying said combination signal, and a second input coupled to said further output of said first combining means carrying said difference signal, an output of said third multiplexer means being coupled to said low-pass filtering means;

first and third register means coupled to the output of said up/down counter for selectively storing an output relating to said DC offset, an output of said first register means being coupled to the input of said digital-to analog converting means;

second and fourth register means also coupled to the output of said up/down counter for selectively storing an output relating to said automatic gain control;

further digital-to-analog converting means coupled to an output of said second register means; and fourth multiplexer means having a first input coupled to an output of said third register means, and a second input coupled to an output of said fourth register means, an output of said fourth multiplexer means being coupled to a count value input of said up/down counter, said second combining means further comprising gain control means for controlling a gain of the input QAM signal, combined with said DC offset signal, in response to an output from said further digital-to-analog converting means representing an automatic gain control signal, wherein said circuit arrangement further comprises switching signal generating means for generating a first switching signal for switching said first, second, third and fourth multiplexer means in synchronism, a second switching signal for causing said first and third register means to store the output from the up/down counter, and a third switching signal for causing said second and fourth register means to store the output from the up/down counter, whereby, during a first switching cycle of said first switching signal, said first and second multiplexer means apply said DC maximum and minimum threshold values to said threshold means, said third multiplexer means applies said combination signal to said low-pass filtering means, and said fourth multiplexer means applies the output from said third register means to said count value input of said up/down counter, and said second switching signal causes said first and second register means to store the output signal from said up/down counter, and during a second switching cycle of said first switching signal, said first and second multiplexer means apply said AGC maximum and minimum threshold values to said threshold means, said third multiplexer means applies said difference signal to said low-pass filtering means, and said fourth multiplexer means applies the output from said fourth register means to said count value input of said up/down counter, and said third switching signal causes the output from said up/down counter to be stored in said second and fourth register means.

* * * * *